United States Patent [19]

Okuzawa

[11] Patent Number: 4,896,185
[45] Date of Patent: Jan. 23, 1990

[54] FILTER DRIVING MECHANISM FOR IMAGE RECORDING DEVICE

[75] Inventor: Tugio Okuzawa, Ashigarakami, Japan

[73] Assignee: Fuji Photo Film Co., Ltd., Kanagawa, Japan

[21] Appl. No.: 169,700

[22] Filed: Mar. 18, 1988

[30] Foreign Application Priority Data

Mar. 19, 1987 [JP] Japan .................................. 62-64842

[51] Int. Cl.$^4$ .................. G03B 27/72; G03B 27/76
[52] U.S. Cl. .................................... 355/35; 355/71; 355/32
[58] Field of Search .............................. 355/35, 32, 71

[56] References Cited

U.S. PATENT DOCUMENTS

| | | | |
|---|---|---|---|
| 3,709,601 | 1/1973 | Zahn et al. | 355/35 |
| 3,813,160 | 5/1974 | Nowak | 355/71 |
| 3,923,393 | 12/1975 | Inoue et al. | 355/35 |
| 3,980,407 | 9/1976 | Hill | 355/71 |
| 4,232,962 | 11/1980 | Sauer | 355/71 |
| 4,249,808 | 2/1981 | Webster | 355/32 |
| 4,319,834 | 3/1982 | Terrill | 355/35 |
| 4,351,608 | 9/1982 | Coote et al. | 355/35 |
| 4,362,383 | 12/1982 | Yonehara et al. | 355/71 |
| 4,444,489 | 4/1984 | Bartel et al. | 355/35 |
| 4,746,955 | 5/1988 | Slayton et al. | 355/35 |

Primary Examiner—Monroe H. Hayes
Attorney, Agent, or Firm—Sughrue, Mion, Zinn, Macpeak & Seas

[57] ABSTRACT

An image recording device applies light including image information from an original through a focusing optical system to a photosensitive member to record the image information on the photosensitive member. A filter driving mechanism in the image recording device includes at least two filter groups each including a plurality of equally spaced filters extending in a main scanning direction, the filter groups being disposed in a plurality of stages between the focusing optical system and the photosensitive member, and moving mechanisms for moving the filter groups back and forth in a direction substantially normal to the main scanning direction.

7 Claims, 5 Drawing Sheets

FILTER DRIVING MECHANISM FOR IMAGE RECORDING DEVICE

BACKGROUND OF THE INVENTION

The present invention relates to a filter driving mechanism for an image recording device, and more particularly to a filter driving mechanism of a small size for an image recording device in which groups of filters such as color density correcting filters are disposed in a number of levels or layers between an original to be duplicated and a photosensitive member, and the layers of filter groups are independently moved to effect highly accurate color density correction or the like with a single filter or layers of filters.

One example of image recording member in the form of microcapsules containing a photosensitive composition is disclosed in Japanese Laid-Open Patent Publication No. 57-179836. The disclosed image recording member is a photosensitive member which employs capsules having a synthetic high-molecular resin wall containing a vinyl compound, a photopolymerization starter, and a colorant precursor. With this photosensitive member, microcapsules are hardened in the pattern of an image through exposure, and then the microcapsules which have not been hardened are broken under pressure to discharge the colorant precursor which then forms a colored image. A high-quality image can be obtained by a simple dry-type process. However, the disclosed photosensitive member is much lower in photosensitivity than photosensitive members which use silver halides such as photographic emulsions.

There has been developed a novel photosensitive member which has high sensitivity and can be processed to produce a high-quality image through a simple dry-type process (see Japanese Laid-Open Patent Publication No. 61-275742). The photosensitive member comprises a support coated with a photosensitive silver halide, a reducing agent, a polymerizable compound, and a color-image-forming material. At least the polymerizable compound and the color-image-forming material are encased in one microcapsule.

An image recording device for recording an image using such a photosensitive member is disclosed in detail in U.S. patent application Ser. No. 942654. In the disclosed image recording device, the photosensitive member is exposed to an image to produce a latent image thereon. Then, the photosensitive member is heated to develop the image by polymerize the polymerizable compound in an area where the latent image is present, thus generating a high-molecular compound to harden microcapsules. Finally, the photosensitive member is superposed under pressure on an image receptive member having an image receptive layer to which a color-image-forming material can be transferred, so that at least some of microcapsules in an area where no latent image is present are broken to transfer the color-image-forming material to the image receptive member for thereby forming a visible image.

In order to form a high-quality and clear visible image on the image receptive member in the above image recording device, various filters such as color density correcting filters are interposed between the photosensitive member and an original to be duplicated for exposing the photosensitive member to the image. This is because image quality may be lowered by a color density irregularity due to a reduction in the amount of light emitted from an exposure light source, a slight change in the mechanical position of a focusing optical system, or a change in the image magnification.

Various proposals have been made for moving the filters between the photosensitive member and the original to be copied. One example of such proposal is disclosed in Japanese Patent Publication No. 58-37535. FIG. 1 of the accompanying drawings illustrates the disclosed arrangement.

As shown in FIG. 1, an original 2 to be duplicated is illuminated with a light beam 6 emitted from a light source 4. The light beam 6 is reflected by the original 2 and applied to a convergent light transmitting body 8. The convergent light transmitting body 8 has an array of rod-shaped lenses 10 arranged in a main scanning direction (normal to the sheet of FIG. 1). The light beam 6 applied to the rod-shaped lenses 10 passes through a density filter 12 and is applied to a photosensitive member 14 to record an image thereon.

The density filter 12 has a plurality of density areas or portions 12a through 12n extending in the main scanning direction and having different optical densities. The amount of light applied to the photosensitive member 14 by the light beam 6 is adjusted by displacing the density filter 12 in the direction of the arrow to position a density area having a desired optical density, such as the density area 12b, below the rod-shaped lenses 10.

With the many different density filters 12a through 12n in the density filter 12, the length of the density filter 12 in a direction normal to the main scanning direction is considerably large. Therefore, a driving mechanism for displacing the density filter 12 back and forth in the direction of the arrow is large in size, and an image recording device in which the driving mechanism is to be incorporated cannot be reduced in size.

Where the density filter 12 is long, it has to be moved a considerable distance, and cannot be moved with high accuracy. As a result, a desired density area may not accurately be positioned below the convergent light transmitting body 8, and it is highly difficult to obtain a high-quality image on the photosensitive member 14.

SUMMARY OF THE INVENTION

It is a general object of the present invention to provide a filter driving mechanism for an image recording device in which two or more spaced groups each composed of a plurality of filters such as color density correcting filters extending in a main scanning direction are disposed in a number of levels or layers between an original to be duplicated and a photosensitive member, and the filter groups are movable back and forth by respective drive sources in a direction normal to the main scanning direction, so that desired filters can be used singly or as layers to reduce the distance which the filter groups move, whereby the filter driving mechanism is small in size and can easily position the filters for a highly accurate image recording process.

Another object of the present invention is to provide a filter driving mechanism in an image recording device for applying light including image information from an original through a focusing optical system to a photosensitive member to record the image information on the photosensitive member, the filter driving mechanism comprising at least two filter groups each including a plurality of equally spaced filters extending in a main scanning direction, the filter groups being disposed in a plurality of stages between the focusing optical system and the photosensitive member, and moving means for moving the filter groups back and forth in a direction substantially normal to the main scanning direction.

Still another object of the present invention is to provide a filter driving mechanism wherein the moving means comprises a rotative drive source, a first pulley operatively coupled to the rotative drive source, a second pulley spaced from the first pulley, and an endless belt trained around the first and second pulleys, the filter groups being mounted on the endless belt, whereby when the rotative drive source is energized, the first pulley is rotated to cause the endless belt to move the filter groups.

Yet another object of the present invention is to provide a filter driving mechanism wherein the filter groups include first and second filter groups, the driving means including first and second moving means, the first moving means comprising a first rotative drive source, a first pulley operatively coupled to the first rotative drive source, a second pulley spaced from the first pulley, and a first endless belt trained around the first and second pulleys, the first filter group being mounted on the first endless belt, the second moving means comprising a second rotative drive source, a third pulley operatively coupled to the second rotative drive source, a fourth pulley spaced from the third pulley, and a second endless belt trained around the third and fourth pulleys, the second filter group being mounted on the second endless belt, the second endless belt being disposed within the first endless belt.

Yet still another object of the present invention is to provide a filter driving mechanism wherein the filter groups include respective filter holders each having a plurality of equally spaced slots defined therein and extending in the main scanning direction, and filters disposed in the slots.

A further object of the present invention is to provide a filter driving mechanism wherein each of the filter holders has a first shorter rod and a second longer rod, the first and second rods projecting outwardly from opposite ends of the filter holder in the main scanning direction, further including guide members each having a plurality of guide slots defined therein, the first and second rods of each filter holder being fitted in one of the guide slots, the second rod being connected to a driving belt of the moving means.

A still further object of the present invention is to provide a filter driving mechanism wherein at least one of the slots of the filter holders is free of any filter.

A yet further object of the present invention is to provide a filter driving mechanism further including position detector means for detecting when the filter groups reach a predetermined position.

A yet still further object of the present invention is to provide a filter driving mechanism wherein the filters comprise color density correction filters.

The above and other objects, features and advantages of the present invention will become more apparent from the following description when taken in conjunction with the accompanying drawings in which a preferred embodiment of the present invention is shown by way of illustrative example.

DESCRIPTION OF THE PREFERRED EMBODIMENT

Figure 1:
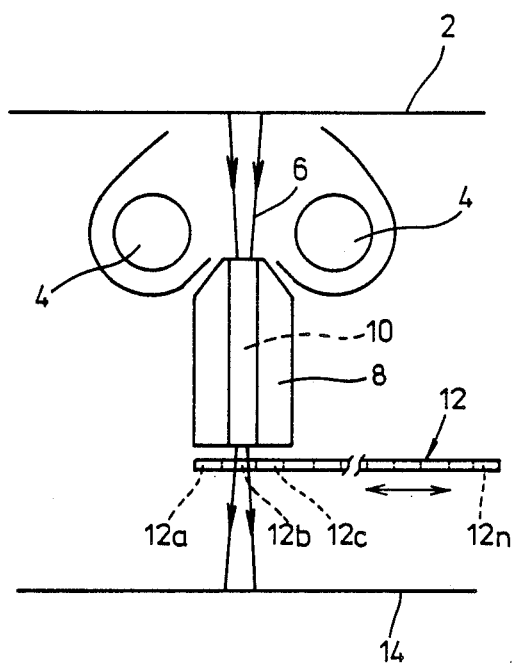
FIG. 1 is a schematic view of a conventional arrangement by which a filter is moved.

Photosensitive members that can be employed in an image recording device which incorporates therein a filter driving mechanism according to the present invention will first be described.

One photosensitive member which can be used may be of the type disclosed in Japanese Laid-Open Patent Publication No. 57-179836. According to this type, a polymerizable compound is hardened in the pattern of an image upon exposure, and then pressure is applied to obtain a visible image. The photosensitive member comprises a support carrying capsules having a synthetic high-molecular resin wall containing a vinyl compound, a photopolymerization starter, and a colorant precursor.

Another photosensitive member is of the type in which a latent image formed by exposure to an image is preliminarily developed thermally in a wet-type process, and thereafter pressure is applied to develop a visible image. One example of this photosensitive member is disclosed in Japanese Laid Open Patent Publication No. 61-278849 or Japanese Laid-Open Patent Publication No. 62-209444. According to the disclosure of the former publication, after the thermal image development, a color-image-forming material is transferred onto an image receptive member having an image receptive layer to produce an image on the image receptive member. The disclosed photosensitive member comprises a support coated with a photosensitive silver halide, a reducing agent, a polymerizable compound, and a color-image-forming material. At least the polymerizable compound and the color-image-forming material are encased in one microcapsule. The photosensitive member disclosed in the latter application forms an image thereon without using any image receptive member, i.e., has an image receptive layer on the photosensitive member itself. The photosensitive member includes a silver halide, a reducing agent, a polymerizable compound, and two types of materials which develop color while in contact. A support carries a photosensitive layer in which one of the materials which develop color and the polymerizable compound are encased in microcapsules, and the other material capable of color development is present outside of the microcapsules.

Still another photosensitive member is a thermal development photosensitive member. Various types of thermal development photosensitive member are known. In one type, movable dye is discharged with heat into an image pattern, and transferred by a solvent such as water to an image receptive member (dye fixing member) having a mordant. In another type, an image is transferred to an image receptive member by an organic solvent having a high boiling point. According to still another type, an image is transferred to an image receptive member by a hydrophilic thermal solvent included in the image receptive member. According to a further photosensitive member, movable dye which is thermally diffusive or sublime is transferred to a dye receiving member such as a support. These photosensitive members are disclosed in U.S. Pat. Nos. 4,463,079, 4,474,867, 4,478,927, 4,507,380, 4,500,626, 4,483,914, 4,503,137, and 4,559,290, U.S. patent applications Nos. 471,073, 471,375, 590,592, 592,195, and 592,203, Japanese Laid-Open Patent Publications Nos. 59-165054, 59-180548, 59-174833, and 59-174834.

In the present embodiment, there is employed a photosensitive member requires a thermal development process for transferring an image to an image receptive member having an image receptive layer.

Figure 2:
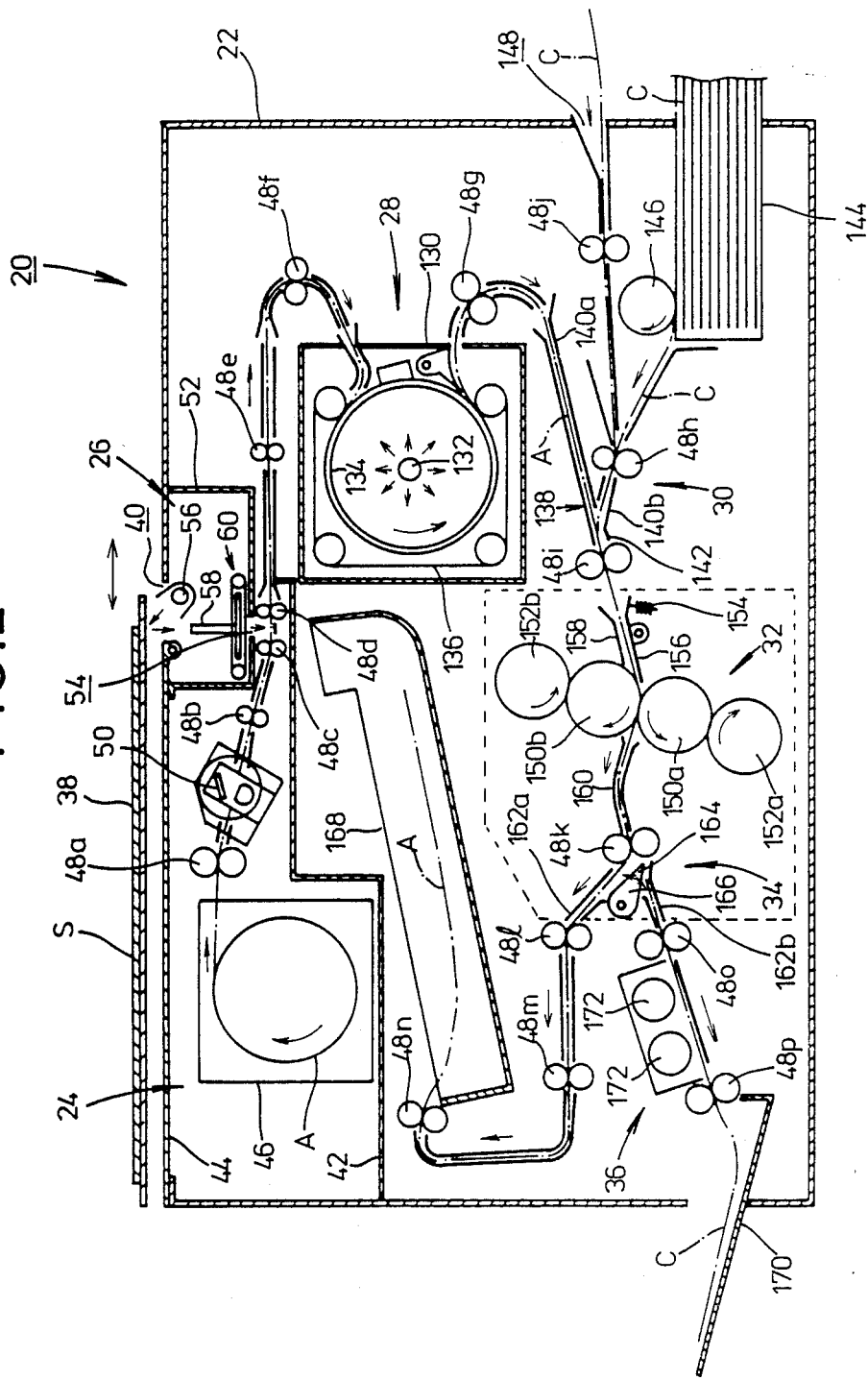
FIG. 2 is a schematic cross-sectional view of an image recording device incorporating a filter driving mechanism according to the present invention.

As shown in FIG. 2, an image recording device 20 incorporating a filter driving mechanism according to the present invention includes a housing 22 accommodating therein a photosensitive member supply unit 24 housing a photosensitive member A, an image reading unit 26 for reading image information carried on an original S, a thermal developing unit 28 for heating the photosensitive member A, a superposing unit 30 for superposing an image receptive sheet C of paper on the photosensitive member A, a pressure transferring unit 32 for pressing the image receptive sheet C and the photosensitive member A against each other, a peeling unit 34 for peeling the image receptive sheet C from the photosensitive member A, and a fixing unit 36 for fixing an image on the image receptive sheet C.

The original S is placed on a transparent support glass sheet 38 on an upper panel of the housing 22. The support glass sheet 38 is reciprocally movable over an opening 40 defined in an upper surface of the image reading unit 26 in the directions of the arrow by means of a feed means (not shown).

The photosensitive member supply unit 24 is disposed in an upper portion of the housing 22 and shielded from light by a partition 42. The photosensitive member supply unit 24 is loaded with a magazine 46 containing a coil of photosensitive member A through an openable cover 44 attached to the upper panel of the housing 22. The photosensitive member A comprises a support coated with at least a photosensitive silver halide, a reducing agent, a polymerizable compound, and a color-image-forming material. At least the polymerizable compound and the color-image-forming material are encased in each of microcapsules.

The photosensitive member supply unit 24 has first through fourth roller pairs 48a through 48d for feeding the photosensitive member A from the magazine 46 to the image reading unit 26. Between the first and second roller pairs 48a, 48b, there is disposed a cutter 50 for cutting off the photosensitive member A to a prescribed length. The partition 52 surrounding the image reading unit 26 has an exposure opening 54 defined therein and positioned between the third and fourth roller pairs 48c, 48d.

The image reading unit 26 includes a light source 56 for illuminating the original S through the opening 40, and a focusing optical system 58. A filter driving mechanism 60 according to the present invention is disposed below the focusing optical system 58.

Figure 3:
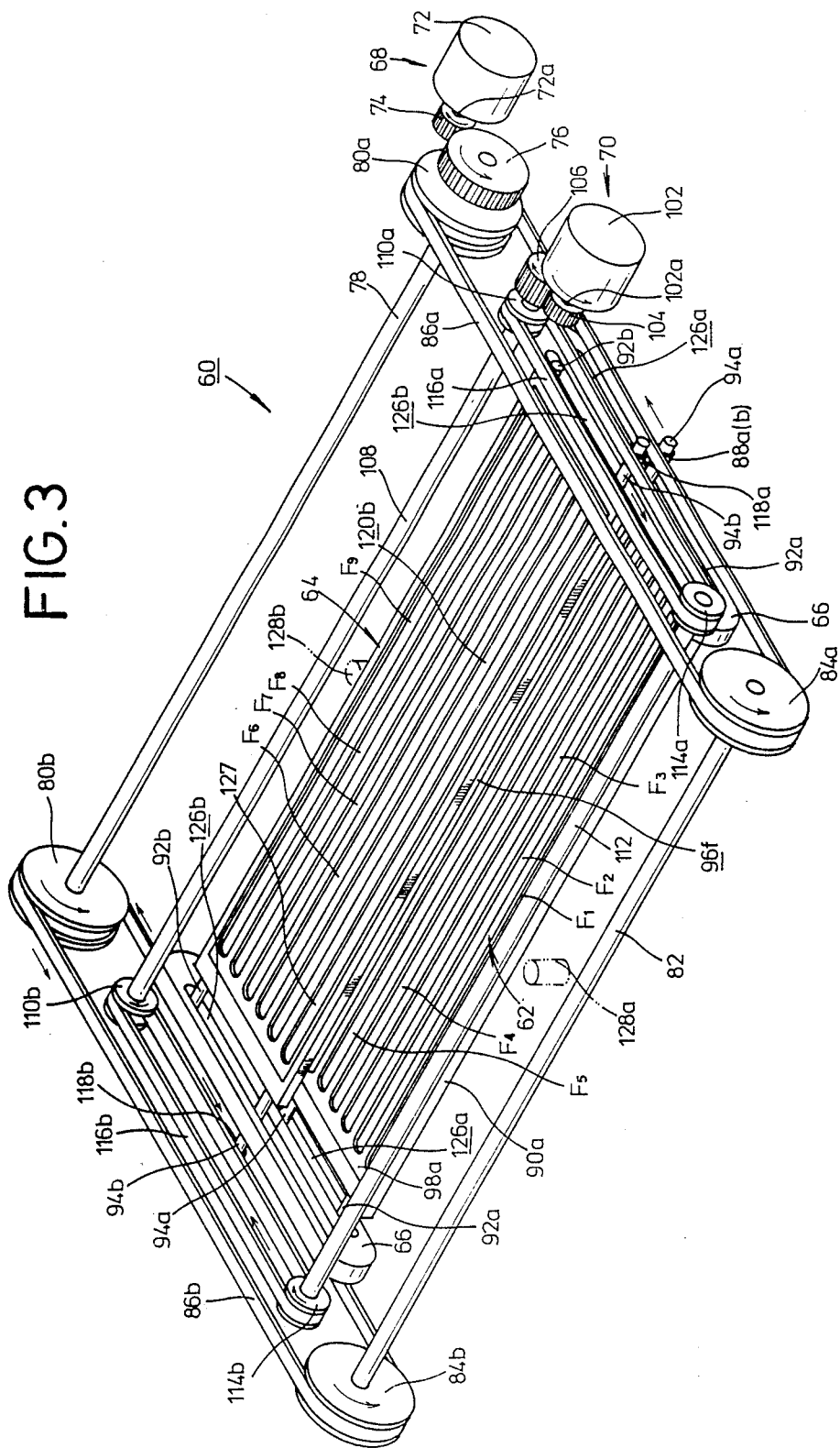
FIG. 3 is a perspective view of the filter driving mechanism.
Figure 4:
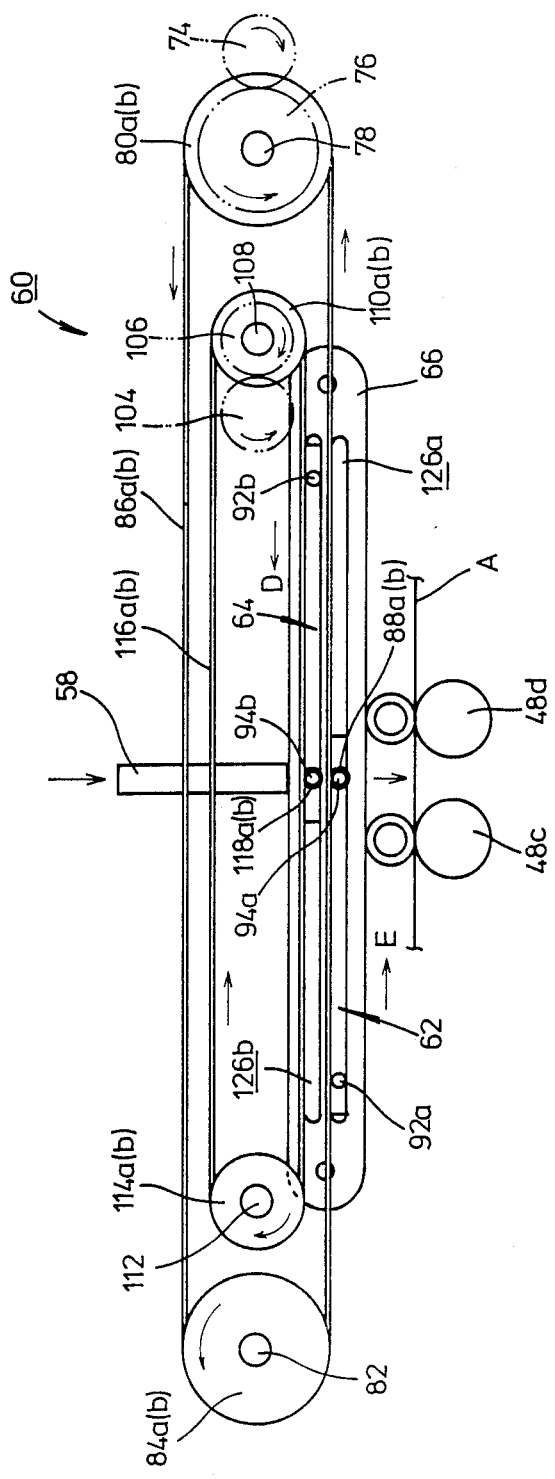
FIG. 4 is a side elevational view of the filter driving mechanism.

As illustrated in FIGS. 3 and 4, the filter driving mechanism 60 includes a first filter holder 62 and a second filter holder 64 which are disposed in two vertically different levels or stages by guide members 66, the first and second filter holders 62, 64 being held in engagement with and movable back and forth by respective first and second moving means 68, 70.

The first moving means 68 has a rotative drive source 72 having a rotatable drive shaft 72a on which a first gear 74 is mounted. The first gear 74 is held in mesh with a second gear 76 which is larger in diameter than the first gear 74, the second gear 74 being mounted on one end of a first rotatable shaft 78 rotatably supported in the image reading unit 26. Pulleys 80a, 80b are supported on respective ends of the first rotatable shaft 78. A second rotatable shaft 82 is also rotatably supported in the image reading unit 26 parallel to the first rotatable shaft 78, the second rotatable shaft 82 being spaced a predetermined distance from the first rotatable shaft 78. Pulleys 84a, 84b are supported on respective ends of the second rotatable shaft 82. First endless belts 86a, 86b are trained around the pulleys 80a, 80b and the pulleys 84a, 84b. The first endless belts 86a, 86b have engaging members 88a, 88b, respectively, on their lower runs, the engaging members 88a, 88b engaging the first filter holder 62.

Figure 5:
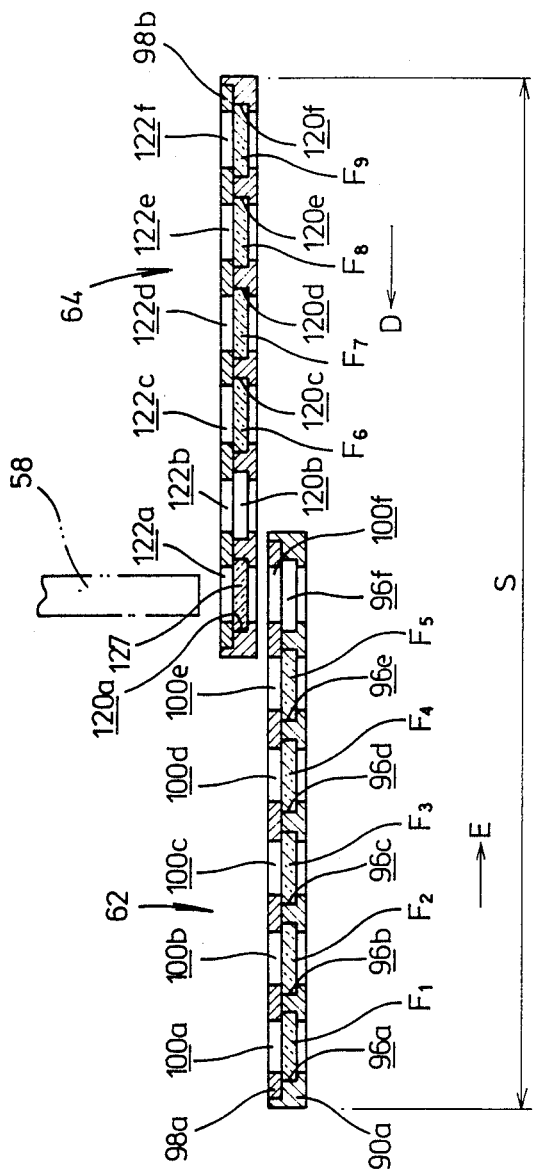
FIG. 5 is a vertical cross-sectional view of filter holders of the filter driving mechanism.

The first filter holder 62 includes a first plate 90a extending in the main scanning direction and having two first shorter rods 92a projecting outwardly from longitudinal opposite ends of the first plate 90a and two second longer rods 94a also projecting outwardly from the fitted in the engaging members 88a, 88b of the first endless belt 86a. The first plate 90a has a plurality of stepped oblong holes or slots 96a through 96f defined therein and extending longitudinally of the first plate 90a. The first filter holder 62 also includes a second plate 98a mounted on the first plate 90a and having a plurality of oblong holes or slots 100a through 100f registered respectively with the stepped slots 96a through 96f of the first plate 90a, as shown in FIG. 5.

As shown in FIGS. 3 and 4, the second moving means 70 has a rotative drive source 102 disposed within the first endless belt 86a and having a rotatable drive shaft 102 on which a third gear 104 is mounted. The third gear 104 is held in mesh with a fourth gear 106 mounted on one end of a third rotatable shaft 108 which supports small-diameter pulleys 110a, 110b respectively on its opposite ends. A fourth rotatable shaft 112 is spaced from the third rotatable shaft 108 and disposed within the first endless belts 86a, 86b. Small-diameter pulleys 114a, 114b are mounted respectively on opposite ends of the fourth rotatable shaft 112. Second endless belts 116a, 116b are trained around the pulleys 114a, 114b and the pulleys 116a, 116b. The second filter holder 64 engage engaging members 118a, 118b attached to lower runs of the second endless belts 116a, 116b.

The second filter holder 64 is identical in construction to the first filter holder 62. Those parts of the second filter holder 64 which are identical to those of the first filter holder 62 are denoted by identical reference numerals with a suffix b, and will not be described in detail. The second filter holder 64 includes a first plate 90b having a plurality of stepped oblong holes or slots 120a through 120f which are spaced at intervals equal to those of the stepped slots 96a through 96f of the first plate 90a, and a second plate 98b having a plurality of oblong holes or slots 122a through 122f defined therein in registry with the stepped slots 120a through 120f, respectively.

The filter holders 62, 64 are guided by respective guide members 66 in the form of plates extending in a direction normal to the main scanning direction. Each of the guide members 66 has a pair of first and second oblong guide holes or slots 126a, 126b vertically spaced from and parallel to each other. The first rods 92a and the second rods 94a of the first filter holder 62 are fitted in the lower first guide slot 126a, whereas the first rods 92b and the second rods 94b of the second filter holder 64 are fitted in the upper second guide slot 126b.

As illustrated in FIG. 5, filters F1 through F5 are disposed respectively in the stepped slots 96a through 96e of the first filter holder 62, and filters F6 through F9 are disposed respectively in the stepped holes 120c through 120f of the second filter holder 64. Each of The filters F1 through F9 has a four-layer structure composed of ND filter, yellow filter, magenta filter, and cyan filter layers. By selecting the color densities of the ND filter, yellow filter, magenta filter, and cyan filter layers, the filters F1 through F9 can effect various different modes of desired color density correction.

The filters F1 through F9 may be inserted into and removed from the stepped slots 96a through 96e and 120c through 120f at longitudinal ends of the first and second filter holders 62, 64. A transparent sheet 127 of glass is mounted in the stepped slot 120a of the second filter holder 64.

A position detector 128a (FIG. 3) such as a photosensor or the like serves to detect when the stepped slot 96f of the first filter holder 62 is positioned below the focusing optical system 58. A position detector 128b such as a photosensor or the like serves to detect when the stepped slot 120a of the second filter holder 64 is positioned below the focusing optical system 58. The position detectors 128a, 128b may be installed in positions which are selected to meet the different filter holders 62, 64.

The thermal developing unit 28 which is surrounded by a thermally insulative partition 130 is disposed below the image reading unit 26. The thermal developing unit 28 is supplied with the photosensitive member A via the image reading unit 26 through fifth and sixth roller pairs 48e, 48f. The thermal developing unit 28 includes a heating drum 134 in the form of a hollow cylinder housing a halogen lamp 132, and an endless belt 136 held against an outer peripheral surface of the heating drum 134. The heating drum 134 and the endless belt 136 grip and feed the photosensitive member A therebetween while heating the same.

The photosensitive member A fed from the thermal developing unit 28 is delivered into the superposing unit 30 via a seventh roller pair 48g. The superposing unit 30 has a Y-shaped guide plate assembly 138 including a first feed passage 140a near the seventh roller pair 48g, a second feed passage 140b near an eighth roller pair 48h, and an outlet passage 142 near a ninth roller pair 48i, the first and second feed passages 140a, 140b being joined to the outlet passage 142.

A cassette 144 housing stacked image receptive sheets C of paper is loaded into a lower corner of the housing 22. A sheet feed roller 146 is disposed upwardly of the cassette 144. An image receptive sheet C is supplied by the sheet feed roller 146 via the eighth roller pair 48h into the second feed passage 140b of the Y-shaped guide plate assembly 138. The housing 22 has a manual insertion slot 148 defined above the cassette 144. An image receptive sheet C may be supplied from the manual insertion slot 148 via a tenth roller pair 48j into the second feed passage 140b.

The pressure transferring unit 32 is positioned rearwardly of the ninth roller pair 48i. The pressure transferring unit 32 comprises a pair of pressing rollers 150a, 150b pressed against each other, and a pair of backup rollers 152a, 152b pressed against the backs of the pressing rollers 150a, 150b for adjusting the pressing forces produced between the pressing rollers 150a, 150b. A blade 156 biased by a coil spring 154 is located laterally of the peripheral surface of the pressing roller 150b for introducing the photosensitive member A and the image receptive sheet C between the pressing rollers 150a, 150b. The blade 156 is disposed in confronting relation to a guide plate 158.

A guide plate 160 is located behind the pressure transferring unit 32 and adjacent to an eleventh roller pair 48k behind which first and second discharge passages 162a 162b defined in a Y shape by guide plates are positioned. The peeling unit 34 comprises a peeling finger 166 disposed between the first and second discharge passages 162a, 162b, the peeling finger 166 being angularly movably supported and having a pointed end 164 directed toward the eleventh roller pair 48k.

The first discharge passage 162a leads to a disposal tray 168 through twelfth through fourteenth roller pairs 48l through 48n, the disposal tray 168 being positioned below the photosensitive member supply unit 24 for receiving the photosensitive member A. The second discharge passage 162b leads to a discharge tray 170 through fifteenth and sixteenth roller pairs 48o, 48p, the discharge tray 170 being positioned at a lower corner of the housing 22 for receiving the image receptive sheet C. The fixing unit 36 which has ultraviolet lamps 172 is disposed between the fifteenth and sixteenth roller pairs 48o, 48p.

Operation and advantages of the image recording device incorporating the filter driving mechanism which is basically constructed as described above will be described below.

In normal condition, the filter holders 62, 64 are positioned as shown in FIG. 5 with the glass sheet 127 of the second filter holder 64 and the stepped slot 96f of the first filter holder 62 being disposed underneath the focusing optical system 58.

The original S bearing image information is placed on the support glass sheet 38, and then fed with the support glass sheet 38 in an auxiliary scanning direction by the feed means (not shown). At this time, the light source 56 in the image reading unit 26 is energized to apply illuminating light through the opening 40 and the support glass sheet 38 to the original S. The photosensitive member A unwound from the magazine 46 loaded in the photosensitive member supply unit 24 is fed by the first through fourth roller pairs 48a through 48d to move along the exposure opening 54 at the same speed as that of the support glass sheet 38.

Light reflected from the image information on the original S is applied to the photosensitive member A through the focusing optical system 58 and the exposure opening 54 in the main scanning direction to form a latent image on the photosensitive member A. The photosensitive member A pulled from the magazine 46 to a predetermined length is cut off by the cutter 50.

After image exposure, the photosensitive member A which is cut off is introduced into the thermal developing unit 28 by the fifth and sixth roller pairs 48e, 48f. In the thermal developing unit 28, the photosensitive member A is fed along while being gripped between the heating drum 134 and the endless belt 13, during which time the photosensitive member A is heated by the halogen lamp 132. As a result, the polymerizable compound in the area of the latent image is polymerized to harden microcapsules in the photosensitive member A.

Thereafter, the photosensitive member A is introduced from the first feed passage 140a of the Y-shaped guide plate assembly 138 into the superposing unit 30 by the seventh roller pair 48g. One of the image receptive sheets C stored in the cassette 144 loaded in the image recording device 20 is taken, at a time, from the cassette 144 by the sheet feed roller 146. The image receptive sheet C is delivered through the eighth roller pair 48h from the second feed passage 140b of the Y-shaped guide plate assembly 138 into the superposing unit 30, in which the image receptive sheet C is held against the lower surface of the photosensitive member A. The photosensitive member A and the image receptive sheet C as they are superposed on each other are positionally adjusted such that the leading end of the photosensitive member A projects more toward the ninth roller pair 48i than the image receptive sheet C. The image receptive sheet C may be supplied by the operator through the manual insertion slot 148 via the tenth roller pair 48j into the superposing unit 30.

The photosensitive member A and the image receptive sheet C as they are fed from the outlet passage 142 of the superposing unit 30 while they are being superposed on each other are introduced into the pressure transferring unit 32 by the ninth roller pair 48i. Since the blade 156 has an end held against the outer peripheral surface of the pressing roller 150b by the coil spring 154, the photosensitive member A and the image receptive sheet C can be inserted between the pressing rollers 150a, 150b without being peeled off each other.

When the photosensitive member A and the image receptive sheet C are pressed together by the pressing rollers 150a, 150b, microcapsules in the area where no latent image is present in the photosensitive member A are broken to transfer the color-image-forming material to the image receptive sheet C for thereby forming an image.

The photosensitive member A and the image receptive sheet C that have been pressed together by the pressure transferring unit 21 are then introduced into the peeling unit 34 through the eleventh roller pair 48k. In the peeling unit 34, the peeling finger 166 is turned in the direction of the arrow to peel the photosensitive member A and the image receptive sheet C from each other. More specifically, since the leading end of the photosensitive member A projects more than the leading end of the image receptive sheet C, the photosensitive member A is fed toward the first discharge passage 162a by the pointed end 164 of the peeling finger 166. The image receptive sheet C is separated from the photosensitive member A by the pointed end 164 of the peeling finger 166 and delivered into the second feed passage 162b.

The image receptive sheet C fed into the second feed passage 162b is sent into the fixing unit 36 by the fifteenth roller pair 48o. The image transferred to the surface of the image receptive sheet C is then fixed by the ultraviolet lamps 172 in the fixing unit 36. Thereafter, the image receptive sheet C is discharged onto the discharge tray 170 by the sixteenth roller pair 48p. The photosensitive member A delivered into the first discharge passage 162a is fed onto the disposal tray 168 by the twelfth through fourteenth roller pairs 48l through 48n.

A process for color density correction employing the filter driving mechanism according to the illustrated embodiment will hereinafter be described in detail.

A test chart for color density adjustment is placed on the support glass sheet 38, and illuminating light emitted from the light source 56 of the image reading unit 26 is applied to the test chart to form a latent image on the photosensitive member A in the manner described above. Thereafter, the photosensitive member A and an image receptive sheet C are pressed against each other to form a visible image on the image receptive sheet C. Then, the visible image on the image receptive sheet C is photoelectrically read by a color density detector (not shown) disposed between the fixing unit 36 and the sixteenth roller pair 48p, and a signal from the color density detector is compared with a reference level stored in a control circuit (not shown). If color density correction is needed as a result of the color density comparison, then a desired filter is selected from the filters F1 through F9.

If the filter F6 on the second filter holder 64 is to be employed for color density correction, then the rotative drive source 102 of the second moving means 70 is energized to rotate the drive shaft 102a about its own axis in the direction of the arrow in FIG. 3. The fourth gear 106 meshing with the third gear 104 mounted on the drive shaft 102a is rotated in the direction of the arrow to cause the third rotatable shaft 108 to rotate the pulleys 110a, 110b in the direction of the arrows. Therefore, the second endless belts 116a, 116b trained around the pulleys 110a, 110b are displaced to displace the second filter holder 64 in the direction of the arrow D (FIGS. 4 and 5) through the engaging members 118a, 118b on the lower runs of the second endless belts 116a, 116b. When the filter F6 in the stepped slot 120c of the second filter holder 64 is positioned below the focusing optical system 58, the rotative drive source 102 is de-energized.

Then, the image reading unit 26 is energized. Illuminating light emitted from the light source 56 is reflected by the original S on the support glass sheet 38, and passes from the focusing optical system 58 through the filter F6 thereby to effect desired color density correction. The light which has been corrected in color density goes through the stepped slot 96f of the first filter holder 62 and is applied to the photosensitive member A via the exposure opening 54.

For using the filter F3 on the first filter holder 62, the rotative drive source 102 of the second moving means 70 is energized to rotate the drive shaft 102a in the direction opposite to the direction of the arrow, thereby causing the third gear 104 to rotate the fourth gear 106 in the direction opposite to the direction of the arrow. The endless belts 116a, 116b are displaced in the direction opposite to the direction of the arrow by the third rotatable shaft 108 supporting the fourth gear 106 thereon until the stepped slot 120b is positioned beneath the focusing optical system 58.

The rotative drive source 102 is de-energized, and the rotative drive source 72 of the first moving means 68 is energized. The first gear 74 mounted on the drive shaft 72a is rotated in the direction of the arrow, and the first rotatable shaft 78 is rotated in the direction of the arrow by the second gear 76 meshing with the first gear 74. Rotation of the first rotatable shaft 78 causes the pulleys 80a, 80b to displace the first endless belts 86a, 86b for thereby displacing the first filter holder 62 engaging the engaging members 88a, 88b in the direction of the arrow E (FIGS. 4 and 5). The rotative drive source 72 is de-energized when the filter F3 is positioned below the focusing optical system 58. Therefore, the stepped slot 120b of the second filter holder 64 and the filter F3 on the first filter holder 62 are now positioned below the focusing optical system 58.

Where one of the filters F1 through F5 on the first filter holder 62 and one of the filters F6 through F9 on the second filter holder 64 are to be used in combination, the moving means 68, 70 are energized to bring these two filters below the focusing optical system 58.

With the aforesaid embodiment, the filter driving mechanism 60 is small in size and the filters F1 through F9 can accurately be positioned with respect to the focusing optical system 58.

More specifically, the first filter holder 62 on which the filters F1 through F5 are mounted and the second filter holder 64 on which the filters F6 through F9 are mounted are disposed in two layers or stages. Therefore, as shown in FIG. 5, when one of the filters F1 through F9 is to be used for color density correction, the first and second filter holders 62, 63 are moved back and forth in overlapping relation within a distance S. The distance which the filter holders 62, 63 have to traverse is thus about half the distance which a single filter holder holding the filters F1 through F9 would have to travel.

Since the distance of travel of each of the filter holders 62, 64 is small, the filters F1 through F9 can easily be positioned, and a desired filter can accurately be placed below the focusing optical system 58. Accordingly, color density correction can reliably be carried out to produce a high-quality visible image.

While the first and second filter holders 62, 64 arranged in two layers or stages are employed in the illustrated embodiment, three filter holders may be disposed in three layers or stages. With such many filter holders used, the stroke or distance which the filter holders have to move is shortened, making it more advantageous to use many filters.

Each of the filters F1 through F9 is of a four-layer construction including ND filter, yellow filter, magenta filter, and cyan filter layers according to the above embodiment. However, each of the filters F1 through F9 may comprise an ND filter, a yellow filter, a magenta filter, or a cyan filter, and these filters may be used in combination. While the color density correction filters F1 through F9 are mounted on the first and second filter holders 62, 64 in the foregoing embodiment, a plurality of filters for achieving different amounts of exposure may be mounted on the first and second filter holders 62, 64.

With the arrangement of the present invention, as described above, two or more filter groups each having a plurality of filters for color density correction or the like are disposed in layers or stages between an original to be copied and a photosensitive member, and are displaceable back and forth by respective driving means. Since the filters are arranged in plural layers or stages, the filter groups are only required to move a reduced distance even if many filters are employed. As a result, the filter driving mechanism may be small in overall size, and the image recording device incorporating the filter drive mechanism may also be small in size. Inasmuch as each of the filter groups is moved a small distance or stroke and the filter groups are driven by the respective driving means, the filters can be positioned with a high degree of accuracy, and images of high quality can be produced.

Although a certain preferred embodiment has been shown and described, it should be understood that many changes and modifications may be made therein without departing from the scope of the appended claims.

What is claimed is:

1. A filter driving mechanism in an image recording device for applying light including image information from an original through a focusing optical system to a photosensitive member to record the image information on the photosensitive member, said filter driving mechanism comprising at least two filter groups each including a plurality of equally spaced filters extending in a main scanning direction, said filter groups being disposed in a plurality of stages between said focusing optical system and said photosensitive member, and moving means for moving said filter groups back and forth in a direction substantially normal to said main scanning direction, wherein said filter groups include respective substantially planar filter holders each having a plurality of equally spaced slots defined therein and extending in said main scanning direction, said filter being disposed in said slots.

2. A filter driving mechanism according to claim 1, wherein said moving means comprises a rotative drive source, a first pulley operatively coupled to said rotative drive source, a second pulley spaced from said first pulley, and an endless belt trained around said first and second pulleys, said filter groups being mounted on said endless belt, whereby when said rotative drive source is energized, said first pulley is rotated to cause said endless belt to move said filter groups.

3. A filter driving mechanism according to claim 1, wherein said filter groups include first and second filter groups, said driving means including first and second moving means, said first moving means comprising a first rotative drive source, a first pulley operatively coupled to said first rotative drive source, a second pulley spaced from said first pulley, and a first endless belt trained around said first and second pulleys, said first filter group being mounted on said first endless belt, said second moving means comprising a second rotative drive source, a third pulley operatively coupled to said second rotative drive source, a fourth pulley spaced from said third pulley, and a second endless belt trained around said third and fourth pulleys, said second filter group being mounted on said second endless belt, said second endless belt being disposed within said first endless belt.

4. A filter driving mechanism according to claim 1, wherein each of said filter holders has a first shorter rod and a second longer rod, said first and second rods projecting outwardly from opposite ends of said filter holder in said main scanning direction, further including guide members each having a plurality, of guide slots defined therein, said first and second rods of each filter holder being fitted in one of said guide slots, said second rod being connected to a driving belt of said moving means.

5. A filter driving mechanism according to claim 1, wherein at least one of said slots of said filter holders is free of any filter.

6. A filter driving mechanism according to claim 1, further including position detector means for detecting when said filter groups reach a predetermined position.

7. A filter driving mechanism according to any one of claims 1 3 and 5, 6 wherein said filters comprise color density correction filters.

* * * * *